United States Patent
Xu et al.

(10) Patent No.: US 10,382,028 B2
(45) Date of Patent: Aug. 13, 2019

(54) VDS COMPARATOR RISE P, FALL P, ON LATE, OFF LATE OUTPUTS FOR ZVC TIMING

(71) Applicant: TEXAS INSTRUMENTS INCORPORATED, Dallas, TX (US)

(72) Inventors: Jingwei Xu, Plano, TX (US); Vijayalakshmi Devarajan, Plano, TX (US); Gangqiang Zhang, Plano, TX (US); Angelo William Pereira, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/128,038

(22) Filed: Sep. 11, 2018

(65) Prior Publication Data

US 2019/0013802 A1    Jan. 10, 2019

Related U.S. Application Data

(62) Division of application No. 15/498,385, filed on Apr. 26, 2017, now Pat. No. 10,116,294.

(51) Int. Cl.
| | |
|---|---|
| H03K 5/1536 | (2006.01) |
| H03K 5/15 | (2006.01) |
| H02J 7/02 | (2016.01) |
| H02J 50/10 | (2016.01) |
| H03K 17/687 | (2006.01) |
| H02J 7/10 | (2006.01) |
| H02M 1/00 | (2006.01) |

(52) U.S. Cl.
CPC ............ *H03K 5/1536* (2013.01); *H02J 7/025* (2013.01); *H02J 50/10* (2016.02); *H03K 5/1508* (2013.01); *H03K 17/687* (2013.01); *H02J 2007/105* (2013.01); *H02M 2001/0058* (2013.01)

(58) Field of Classification Search
None
See application file for complete search history.

(56) References Cited

U.S. PATENT DOCUMENTS

| | | | |
|---|---|---|---|
| 5,757,173 A | 5/1998 | Agiman | |
| 7,330,065 B2 | 2/2008 | Simonson | |
| 10,116,294 B1 * | 10/2018 | Xu | ........................ H03K 5/1536 |
| 2010/0327947 A1 | 12/2010 | Havanur | |
| 2015/0145565 A1 | 5/2015 | Brinlee | |
| 2016/0036339 A1 | 2/2016 | Kikuchi | |

OTHER PUBLICATIONS

European Search Report dated Sep. 13, 2018.

\* cited by examiner

*Primary Examiner* — Cassandra F Cox
(74) *Attorney, Agent, or Firm* — Lawrence J. Bassuk; Charles A. Brill; Frank D. Cimino (57) ABSTRACT

Methods and apparatus for detecting zero-volt crossing in a field-effect transistor. A comparator compares a drain-to source voltage of the transistor to a threshold voltage. A gate voltage signal of the transistor is provided to a clock input of the comparator such that said gate voltage signal is used to latch a result of said comparison to an output of the comparator. A control function with respect to the transistor is performed based on the value of the comparator output.

15 Claims, 4 Drawing Sheets

VDS COMPARATOR RISE P, FALL P, ON LATE, OFF LATE OUTPUTS FOR ZVC TIMING

This application is a divisional of prior application Ser. No. 15/498,385, filed Apr. 26, 2017, now U.S. Pat. No. 10,116,294, issued Oct. 30, 2018;

BACKGROUND

Zero-volt switching (ZVS) is a switching scheme wherein a field-effect transistor (FET) delivering power to a load is switched on or off only when the drain-source voltage is at or near zero volts. Zero-volt switching uses pulse width modulation (PWM), but with an additional separate phase to the PWM timing to allow for ZVS operation. Zero-volt switching enables the voltage regulator to engage in "soft switching," thus avoiding the switching losses that are typically incurred during conventional PWM operation and timing.

Zero-volt switching can be employed in a variety of power conversion systems that require high switching frequencies at higher input voltages and voltage drops. Wireless power transfer and charging systems are an example of a technology that can benefit greatly from zero-volt switching. The Alliance For Wireless Power (A4WP) is an industry standard group that uses the principles of magnetic resonance to develop a wireless energy transfer system over distance. A4WP wireless power transfer uses directed and controlled magnetic fields to replace traditional power cords. To do this, the transmitter utilizes one or more primary windings in order to induce an even magnetic field above its surface. A receiver in the magnetic field uses a secondary winding which captures the magnetic energy and converts it back to electrical energy. In A4WP wireless power transfer, the switching frequencies are multiples of 6.78 MHz. Accurate zero-voltage crossing (ZVC) detection is the starting point for high efficiency ZVS control. With such high-frequency switching, the timing accuracy of the zero-volt switching needs to be on the order of a nanosecond. Conventional zero-voltage crossing detection methods employ very fast comparators and gate drivers that have very little delay. However, typical comparator delay is already above the aforementioned nanosecond range.

SUMMARY

Illustrative aspects of the present disclosure are directed to a control module for controlling a field-effect transistor. The control module includes a comparator and control circuitry. The comparator receives the drain-to-source voltage of the transistor and compares it to a threshold voltage. The comparator has a clock input that receives a gate voltage of the transistor, such that the received gate voltage is used to latch a result of the comparison to an output of the comparator. The control circuitry receives the comparator output and performs a control function with respect to the transistor based on the value of the comparator output.

Other illustrative aspects of the present disclosure are directed to a control module for controlling a field-effect transistor. The control module includes a drain-to-source voltage comparator, a gate-to-source voltage comparator, and at least one latching element. The drain-to-source voltage comparator receives the drain-to-source voltage ($V_{ds}$) of the transistor and compares it to a $V_{ds}$ threshold. The $V_{ds}$ comparator has at least one output configured to provide a $V_{ds}$ edge transition signal indicative of $V_{ds}$ crossing the $V_{ds}$ threshold. The gate-to-source voltage comparator receives the gate-to-source voltage ($V_{gs}$) of the transistor and compares it to a $V_{gs}$ threshold. The $V_{gs}$ comparator has at least one output configured to provide a $V_{gs}$ edge transition signal indicative of $V_{gs}$ crossing the $V_{gs}$ threshold. The at least one latching element has a data input, a clock input, and an output. The data input is operably coupled to receive a $V_{ds}$ edge transition signal from the $V_{ds}$ comparator, and the clock input is operably coupled to receive a $V_{gs}$ edge transition signal from the $V_{gs}$ comparator, such that the $V_{gs}$ edge transition signal serves to latch the $V_{ds}$ edge transition signal to the latch output.

Other illustrative aspects of the present disclosure are directed to a method of controlling a field-effect transistor. Pursuant to this illustrative method, a comparator compares a drain-to source voltage of the transistor to a threshold voltage. A gate voltage signal of the transistor is provided to a clock input of the comparator such that said gate voltage signal is used to latch a result of said comparison to an output of the comparator. A control function with respect to the transistor is performed based on the value of the comparator output.

DETAILED DESCRIPTION

Illustrative aspects of the present disclosure are directed to techniques for achieving accurate and efficient zero-volt crossing detection in a high-frequency zero-volt-switching system. For purposes of illustration, the zero-volt-crossing detection methods of the present disclosure will be described with respect to an A4WP wireless power transfer and charging system. However, it will be appreciated by those of skill in the art that aspects of the present disclosure are applicable to substantially any system that employs zero-volt switching.

Figure 1:
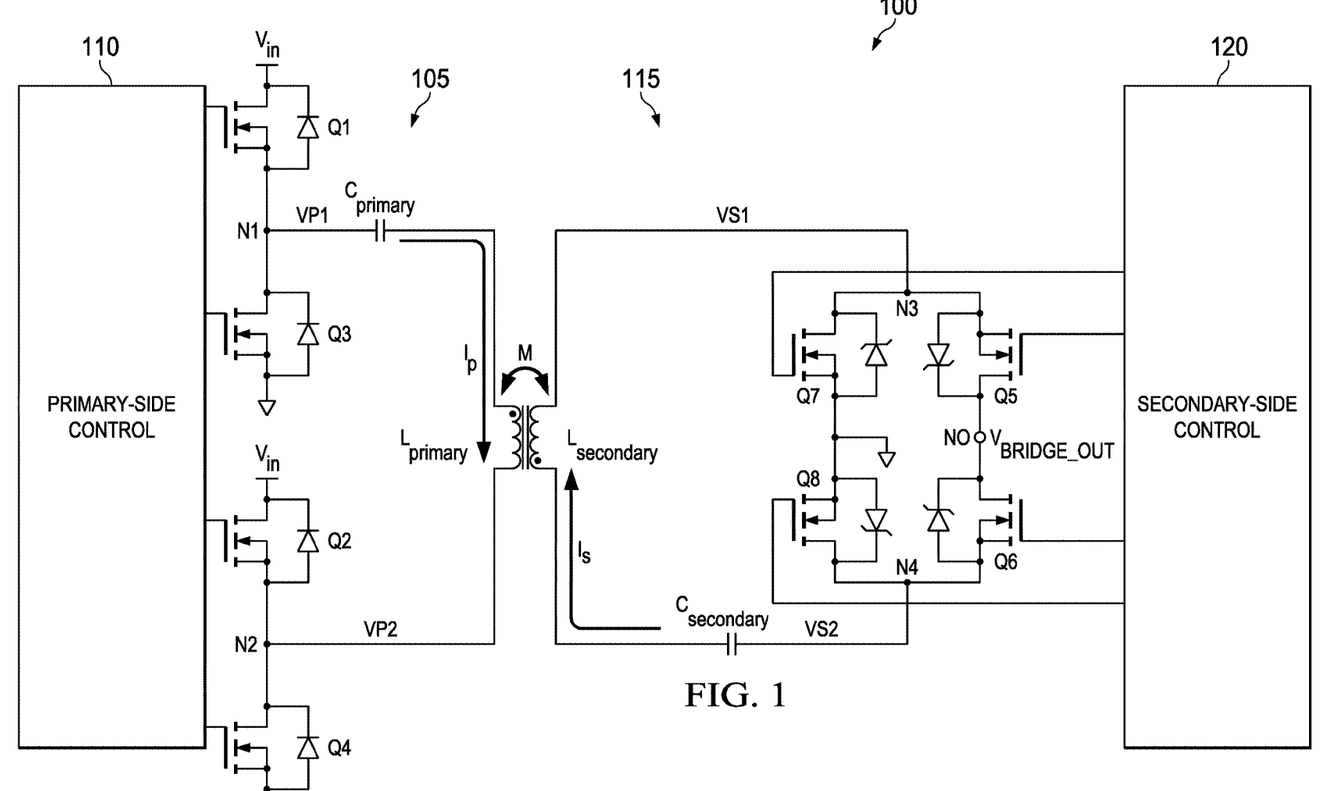
FIG. 1 is a schematic block diagram of an illustrative wireless power transfer system.

FIG. 1 is a schematic block diagram of an illustrative wireless power transfer system 100. The primary side 105 of the wireless power transfer system 100 includes a primary-side control module 110, which illustratively comprises an integrated circuit controller. The primary-side control module 110 generates control signals and provides them to external switches Q1, Q2, Q3 and Q4. In the illustrative embodiment shown in FIG. 1, the switches Q1, Q2, Q4 and Q4 are metal-oxide-semiconductor field-effect transistors (MOSFETs) and the control signals provided by the primary-side control module 110 are gate-driver signals. The junction of switches Q1 and Q3 define a tank node N1, and the junction of switches Q2 and Q4 define a tank node N2. Specifically, in the illustrative embodiment of FIG. 1, tank node N1 is defined by the junction of the source of transistor Q1 and the drain of transistor Q3. Tank node N2 is defined by the junction of the source of transistor Q2 and the drain of transistor Q4. The drains of transistors Q1 and Q2 are coupled to an input voltage $V_{in}$. The sources of transistors Q3 and Q4 are coupled to ground. Tank nodes N1 and N2 are coupled to a primary-side LC tank circuit comprising primary-side capacitor $C_{primary}$ and primary-side inductor $L_{primary}$. The tank node N1 is coupled to a first terminal of primary-side capacitor $C_{primary}$. The primary-side inductor $L_{primary}$ is coupled between the second terminal of capacitor $C_{primary}$ and tank node N2.

Primary-side inductor $L_{primary}$ is inductively coupled across air gap M to secondary-side inductor $L_{secondary}$. On the secondary side 115 of the wireless power transfer system 100, an LC tank circuit comprising secondary-side inductor $L_{secondary}$, and secondary-side capacitor $C_{secondary}$ is coupled to tank nodes N3 and N4. The tank node N3 is coupled to a first terminal of the secondary-side inductor $L_{secondary}$. The secondary-side capacitor $C_{secondary}$ is coupled between the second terminal of inductor $L_{secondary}$, and tank node N4. A secondary-side control module 120, which in an illustrative embodiment comprises an integrated circuit controller, generates control signals and provides them to external switches Q5, Q6, Q7 and Q8 arranged in an H-bridge configuration. In illustrative embodiments, the primary-side control module 110 and the secondary-side control module 120 are part of a single integrated circuit. In the illustrative embodiment shown in FIG. 1, the switches Q5, Q6, Q7 and Q8 are MOSFETs and the control signals provided by the secondary-side control module 120 are gate-driver signals. The junction of switches Q5 and Q7 define tank node N3, and the junction of switches Q6 and Q8 define tank node N4. Specifically, in the illustrative embodiment of FIG. 1, tank node N3 is defined by the junction of the source of transistor Q5 and the drain of transistor Q7. Tank node N4 is defined by the junction of the source of transistor Q6 and the drain of transistor Q8. The sources of transistors Q7 and Q8 are coupled to ground. The drains of transistors Q5 and Q6 define an output node NO that provides an output voltage $V_{BRIDGE\_OUT}$.

In illustrative embodiments, an integrated phase-locked loop (PLL) (not shown) locks onto an external high-frequency crystal oscillator (also not shown). The phase-locked loop is illustratively integrated on the same integrated circuit as the primary-side control module 110 and the secondary-side control module 120. The primary-side control module 110 includes a digital pulse-width modulation (PWM) generation state machine that works in tandem with the phase-locked loop to generate the driving waveforms that drive four gate-driver circuits in the primary-side control module 110. The four gate-driver circuits, in turn, drive the gates of the primary-side transistors Q1, Q2, Q3 and Q4 and the series LC resonant tank in order to transmit power across the air gap M. On the secondary side 115, the recovered signal captured across the resonator capacitor $C_{secondary}$ is sliced to generate the digital reference signal for the phase-locked loop. The secondary-side control module 120 includes a PWM generation state machine seeks to drive the gates of the transistors Q5, Q6, Q7 and Q8 of the secondary-side H-bridge for synchronous rectification. In order to maximize efficiency on the primary side 105 and the secondary side 115, it is important to optimize the switching times for the transistors Q1-Q8. Zero-volt switching (ZVS) is an effective means of optimizing these switching times. Precise zero-volt crossing (ZVC) detection is crucial for maximizing the efficiency of a ZVS scheme.

A zero-volt switching event determines the turn-on event of each of the primary-side transistors Q1-Q4. The turn-off edge is conveniently synced to the reference clock, which sets up the timing reference of the whole system. On the secondary side 115, the timing reference is based on the current waveform $I_P$ through the primary-side inductor $L_{primary}$. The secondary-side control module 120 performs synchronous rectification that emulates a full bridge diode rectifier. Zero-volt switching conditions are detected for both turn-on and turn-off edges of the secondary-side transistors Q5-Q8.

Figure 2:
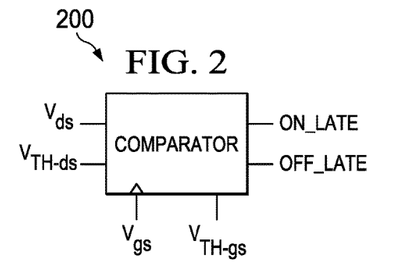
FIG. 2 is a functional block diagram representing a comparator for use in a zero-volt switching detection circuit in accordance with illustrative embodiments of the present disclosure.

To illustrate aspects of switching control in accordance with the present disclosure, the operation and control of transistor Q1 will now be described. It is to be understood that this description regarding transistor Q1 also pertains to the other primary-side transistors Q2-Q4, as well as, in many respects, the secondary-side transistors Q5-Q8. The drain-to-source voltage signal $V_{ds}$ of transistor Q1 is complex due to the ringing generated by the bond wires of the transistor. The additional voltage resulting from $L_{primary}(dI_P/dt)$ can be greater than $I_{ds}R_{ds}$. A ZVS detection circuit in the primary-side control module 110 detects if the $V_{ds}$ of the corresponding transistor Q1 is above or below a predetermined threshold $V_{TH-ds}$. In an illustrative embodiment, the ZVS detection circuit includes a comparator that compares $V_{ds}$ to the predetermined threshold $V_{TH-ds}$. FIG. 2 is a functional block diagram representing a comparator 200 for use in such a ZVS detection circuit in accordance with illustrative aspects of the present disclosure. In illustrative embodiments, there is a comparator such as the comparator 200 of FIG. 2 corresponding to each of the external transistors Q1-Q8. Ideally, the threshold $V_{TH-ds}$ would be set at 0 V. But in an illustrative embodiment, $V_{TH-ds}$ is set at a value which is still reasonably close to ZVS condition, but relatively immune to parasitic effects, such as 1 V. The gate-to-source voltage $V_{gs}$ of the transistor is used as a clock to latch the comparator output. The comparator 200 has two outputs which will be referred to herein as ON_LATE and OFF_LATE. The latched outputs, ON_LATE and OFF_LATE, indicate whether the switching edge is early or late relative to ZVS condition. The primary-side control module 105 uses the ON_LATE and OFF_LATE flags to adjust the timing control of the gate-driver signal provided to transistor Q1 to minimize the delay between the transistor switching time and the $V_{ds}$ zero-crossing time. The flags are illustratively used by the PWM state machine to generate desired switching waveforms. In illustrative embodiments, both the ON_LATE and OFF_LATE signals are averaged over multiple (for example, eight) PWM cycles to obtain the average value over a longer time period and thereby reduce noise sensitivity. It is again noted that, while this switching control scheme is described with respect to transistor Q1, the same or similar principles apply to the other primary-side transistor Q2-Q4, as well as to the secondary-side transistors Q5-Q8.

When the $V_{gs}$ signal transitions from low to high, as indicated by the $V_{gs}$ crossing a gate-to-source threshold voltage $V_{TH-gs}$, the result of the comparison of the $V_{ds}$ signal to the drain-to-source threshold voltage $V_{TH-ds}$ is latched to the ON_LATE output of the comparator 200. If the drainto-source voltage $V_{ds}$ is less than the threshold voltage when the $V_{gs}$ signal goes high (thereby latching the comparator output), the ON_LATE output signal becomes (or remains) 1 (logic-high), indicating that the gate-driver signal went high (turning the transistor Q1 on) after the $V_{ds}$ signal dropped to zero. Thus it can be said that the gate-driver signal turned the transistor Q1 on late. If, on the other hand, the drain-to-source voltage $V_{ds}$ is still greater than the threshold voltage when the $V_{gs}$ signal goes high, the ON_LATE output signal becomes (or remains) 0 (logic-low), indicating that the gate-driver signal went high before the $V_{ds}$ signal dropped to zero. Note that the $V_{ds}$ signal can change earlier than, or later than, the gate-driver signal switches the transistor on or off due to the effects of current driven through the LC tank circuit by the associated load. In either case, $V_{ds}$ will become low before $V_{gs}$ becomes high. For maximum switching efficiency, it is desirable that the gate-driver signal (and therefore the $V_{gs}$ signal) goes high and the $V_{ds}$ signal goes low as close to simultaneously as possible.

When the $V_{gs}$ signal transitions from high to low, the result of the comparison of the $V_{ds}$ signal to the threshold voltage $V_{TH\text{-}ds}$ is latched to the OFF_LATE output of the comparator 200. If the drain-to-source voltage $V_{ds}$ starts to rise and crosses the threshold voltage $V_{TH\text{-}ds}$ immediately after the $V_{gs}$ signal goes low (thereby latching the comparator output), the OFF_LATE output signal becomes (or remains) 1 (logic-high), indicating that the gate-driver signal held the transistor Q1 on and kept $V_{ds}$ low, otherwise the LC tank circuit would have driven $V_{ds}$ high (to its off-state voltage level). Thus it can be said that the gate-driver signal turned the transistor Q1 off late. If, on the other hand, the drain-to-source voltage $V_{ds}$ doesn't immediately rise when the $V_{gs}$ signal goes low, the OFF_LATE output signal becomes 0 (logic-low), indicating that the gate-driver signal went low before the $V_{ds}$ signal dropped to zero. For maximum switching efficiency, it is desirable that the gate-driver signal (and therefore the $V_{gs}$ signal) goes low and the $V_{ds}$ signal goes high as close to simultaneously as possible.

Figure 3:
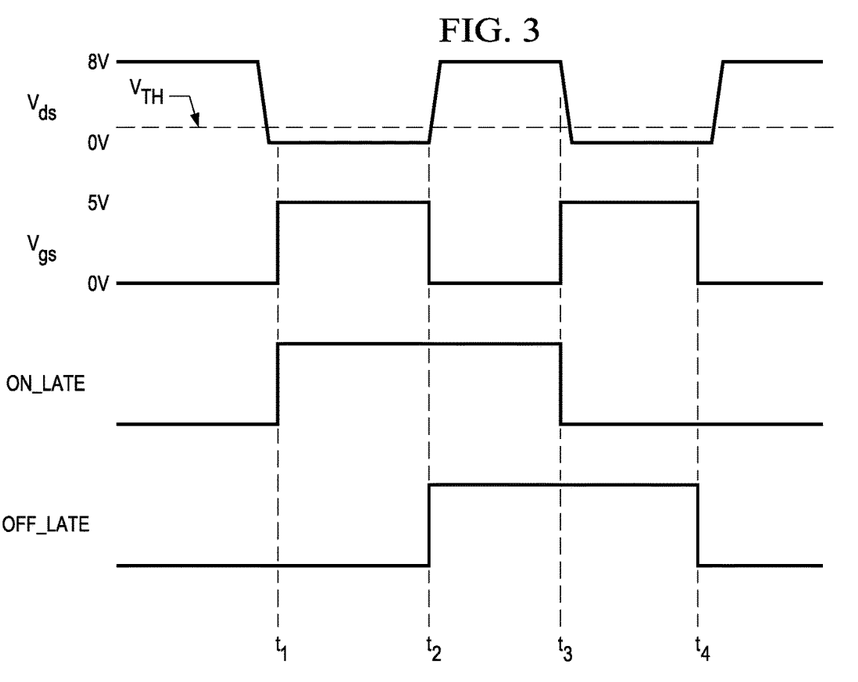
FIG. 3 is a timing diagram demonstrating timing relationships between the $V_{ds}$ signal, the $V_{gs}$ signal, the ON_LATE flag, and the OFF_LATE flag in accordance with illustrative embodiments of the present disclosure.

FIG. 3 is a timing diagram demonstrating illustrative timing relationships between the $V_{ds}$ signal, the $V_{gs}$ signal, the ON_LATE flag, and the OFF_LATE flag. For purposes of demonstrating the use of the $V_{gs}$ signal to latch the $V_{ds}$ comparator, the timing diagram of FIG. 3 represents an ideal system without taking into account various system delays that exist in real-world systems. Such delays will be described and accounted for later in this disclosure. As previously explained, the gate-to-source voltage $V_{gs}$ is used to latch the outputs of the comparator 200. When the $V_{gs}$ signal goes high, the result of the comparison of the drain-to-source voltage $V_{ds}$ to the threshold voltage $V_{TH\text{-}ds}$ is latched to the ON_LATE output. At a time $t_1$ in FIG. 3, the $V_{gs}$ signal goes high, by virtue of the gate-driver signal provided by the primary-side control module 110 (or, for secondary-side transistors Q5-Q8, by the secondary-side control module). As can be seen in FIG. 3, at time $t_1$, the drain-to-source voltage $V_{ds}$ has already dropped below the comparator threshold voltage $V_{TH\text{-}ds}$, which in the illustrative embodiment of FIG. 3 is shown to be approximately 1V. Thus $V_{ds}$ is less than $V_{TH\text{-}ds}$ and the ON_LATE flag goes high, indicating that the gate-driver signal turned the transistor on late, i.e., after the $V_{ds}$ signal has already gone low.

As mentioned above, when the $V_{gs}$ signal goes low, the result of the comparison of the drain-to-source voltage $V_{ds}$ to the threshold voltage $V_{TH\text{-}ds}$ is latched to the OFF_LATE output. At a time $t_2$ in FIG. 3, the $V_{gs}$ signal goes low, by virtue of the gate-driver signal provided by the primary-side control module 110 (or, for secondary-side transistors Q5-Q8, by the secondary-side control module). As can be seen in FIG. 3, at time $t_2$, the drain-to-source voltage $V_{ds}$ starts to rise and crosses the threshold voltage $V_{TH\text{-}ds}$ immediately after the $V_{gs}$ signal goes low. Thus the OFF_LATE flag goes high, indicating that the gate-driver signal turned the transistor off late.

At a time $t_3$ in FIG. 3, the $V_{gs}$ signal goes high again. As can be seen in FIG. 3, at time $t_3$, the drain-to-source voltage $V_{ds}$ is still greater than the threshold voltage $V_{TH}$, and therefore the ON_LATE flag goes low, indicating that the gate-driver signal turned the transistor on early, i.e., before the $V_{ds}$ signal has gone low. At a time $t_4$ in FIG. 3, the $V_{gs}$ signal goes low again. At time $t_3$, the drain-to-source voltage $V_{ds}$ is still less than the threshold voltage $V_{TH}$, and therefore the OFF_LATE flag goes low, indicating that the gate-driver signal turned the transistor off early, i.e., before the $V_{ds}$ signal has gone high.

In illustrative embodiments, a PWM state machine in the primary-side control module 110 uses the latched outputs from the $V_{ds}$ comparators corresponding to each of the primary-side transistors Q1-Q4 to regulate control bits to the phase-locked loop. Similarly, a PWM state machine in the secondary-side control module 120 uses the latched outputs from the $V_{ds}$ comparators corresponding to each of the secondary-side transistors Q5-Q8 to regulate control bits to the phase-locked loop. The PWM state machines employ control algorithms that seek to obtain locking positions for the rising and falling edges of the gate-driver waveforms. These algorithms illustratively employ an initial pulse-width value for the gate-driver waveforms. For example, in an illustrative embodiment, the hard-coded values for the initial pulse widths at the beginning of the search algorithm are set to ~40% DC on the primary side and ~10% DC on the secondary side. During operation, the pulse widths are then adjusted dynamically based on the values of the ON_LATE and OFF_LATE flags (illustratively averaged over multiple PWM cycles) in order to maximize the alignment of the $V_{ds}$ and $V_{gs}$ signals.

In an illustrative embodiment, the primary-side PWM state machine and the secondary-side PWM state machine each first seeks to lock the rising edge of the gate-driver waveform to the ON_LATE flag. This is done by successively shifting the position of the rising edge of the gate-driver signal until the ON_LATE flag changes state. In illustrative embodiments, the time period between position changes is programmable via non-volatile memory (NVM) and can be tuned based on the bandwidth requirements of the system. The PWM state machine next repeats the process for the falling edge. The PWM state machine performs this process with respect to all four external transistors (transistors Q1-Q4 for the primary-side PWM state machine and transistors Q5-Q8 for the secondary-side PWM state machine). When both the rising and falling edges for all four external transistors have attained optimal positions for zero-volt switching, the state machine toggles the edges around those positions.

Figure 4:
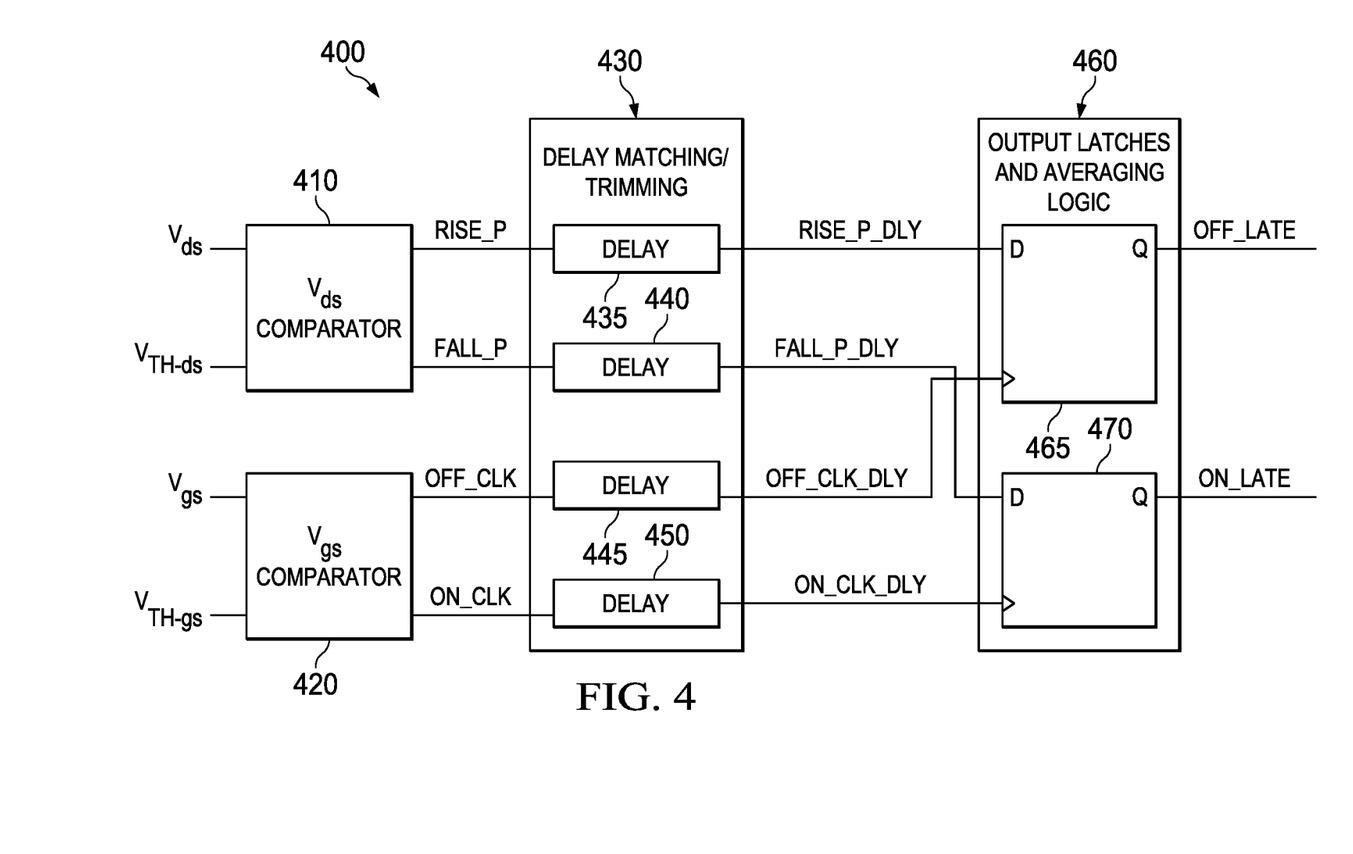
FIG. 4 is a functional block diagram representing a comparator system capable of implementing a comparator such as the comparator described with respect FIG. 2 in accordance with illustrative embodiments of the present disclosure.

FIG. 4 is a functional block diagram representing a comparator system 400 that implements a comparator such as the comparator 200 described with respect FIGS. 2 and 3 in accordance with illustrative embodiments of the present invention. The comparator system 400 implements the timing control scheme, described with respect to FIGS. 2 and 3, whereby the $V_{gs}$ signal is used as a clock signal controlling the latching of the outputs of the comparator 200 (or the outputs of the comparator system 400). The comparator system 400 also accounts for some of the aforementioned timing delays present in a real-world system. As can be seen in FIG. 4, the comparator system 400 actually employs two comparators—a $V_{ds}$ comparator 410 and a $V_{gs}$ comparator 420. $V_{ds}$ comparator 410 receives the drain-to-source voltage $V_{ds}$ and compares it to the predetermined threshold $V_{TH\text{-}ds}$. As mentioned with respect to FIG. 2, ideally, the threshold $V_{TH\text{-}ds}$ would be set at 0 V. But in an illustrative embodiment, $V_{TH\text{-}ds}$ is set at a value, such as 1 V, which is still reasonably close to ZVS condition, but relatively immune to parasitic effects. The $V_{ds}$ comparator 410 has two outputs, referred to herein as RISE_P and FALL_P. The RISE_P output responds to the rising edge of the $V_{ds}$ signal by going high when the $V_{ds}$ signal rises above the voltage threshold $V_{TH\text{-}ds}$. The FALL_P output responds to the falling edge of the $V_{ds}$ signal by going high when the $V_{ds}$ signal drops below the voltage threshold $V_{TH\text{-}ds}$.

$V_{gs}$ comparator 420 receives the gate-to-source voltage $V_{ds}$ and compares it to a predetermined value that corresponds to the turn-on threshold voltage of the associated transistor. In an illustrative embodiment, the $V_{gs}$ input of the $V_{gs}$ comparator 420 is coupled directly to the gate-up and gate-down pins of the gate-driver circuit. The $V_{gs}$ comparator 420 has two outputs, referred to herein as ON_CLK and OFF_CLK. The ON_CLK output responds to the rising edge of the $V_{ds}$ signal by going high when the $V_{gs}$ signal rises above the voltage threshold $V_{TH\text{-}gs}$. The OFF_CLK output responds to the falling edge of the $V_{ds}$ signal by going high when the $V_{gs}$ signal drops below the voltage threshold $V_{TH\text{-}gs}$.

The $V_{ds}$ comparator 410 and $V_{gs}$ comparator 420 are both subject to an inherent amount of delay. That is, there is an inherent amount of delay between the time that the $V_{ds}$ signal changes state (i.e., rises above, or drops below, the voltage threshold $V_{TH\text{-}ds}$) and the time that the corresponding $V_{ds}$ output (RISE_P or FALL_P) changes state (i.e., goes high or goes low). Likewise, there is an inherent amount of delay between the time that the $V_{gs}$ signal changes state (i.e., rises above, or drops below, the voltage threshold $V_{TH\text{-}gs}$) and the time that the corresponding $V_{ds}$ output changes state. The amount of delay introduced by the $V_{ds}$ comparator 410 and $V_{gs}$ comparator 420 can vary from part to part, and also in response to process variance. The delay matching/trimming module 430 includes circuitry that accounts for and adjusts for these inherent delays. Each of the outputs of both the $V_{ds}$ comparator 410 and the $V_{gs}$ comparator 420 are provided to a delay element in the delay matching/trimming module 430. Specifically, the RISE_P signal is provided to delay element 435, the FALL_P signal is provided to delay element 440, the OFF_CLK signal is provided to delay element 445, and the ON_CLK signal is provided to delay element 450. Each of the delay elements 435-450 also includes a trim input (not shown) for receiving a trim value that dictates an amount of delay that is to be introduced by the corresponding delay element. These trim values can be determined during or after manufacture by various methods that can include testing. In an illustrative embodiment, the trim values are stored in non-volatile memory. In this way, the delay matching/trimming module 430 can compensate for the delays inherent in the $V_{ds}$ comparator 410 and $V_{gs}$ comparator 420. In illustrative embodiments, the delay matching/trimming module 430 also compensates for the delay that exists between the time that the PWM signal controlling the gate-driver circuit changes state and the time that the gate voltage changes in response thereto.

The delay matching/trimming module 430 thus produces delay-adjusted versions of the signals received from the $V_{ds}$ comparator 410 and $V_{gs}$ comparator 420. Specifically, delay element 435 outputs a signal referred to herein as RISE_P_DLY, delay element 440 outputs a signal referred to herein as FALL_P_DLY, delay element 445 outputs a signal referred to herein as OFF_CLK_DLY, and delay element 450 outputs a signal referred to herein as ON_CLK_DLY.

The output latches and averaging logic module 460 receives the delay-adjusted outputs of the $V_{ds}$ comparator 410 and $V_{gs}$ comparator 420 from the delay matching/trimming module 430. The output latches and averaging logic module 460 implements the latching of the outputs of the $V_{ds}$ comparator 410 at times dictated by the rising and falling edges of the $V_{gs}$ signal as represented by the outputs of the $V_{gs}$ comparator 420. In the illustrative embodiment represented by FIG. 4, the latching of the ON_LATE and ON_LATE flags is implemented using two D flip-flops 465 and 470. D flip-flop 470 receives the FALL_P_DLY signal from the delay matching/trimming module 430 at its D input and receives the ON.CLK.DLY signal at its clock input. Thus, when the ON_CLK_DLY signal goes high, indicating that the gate-to-source voltage $V_{gs}$ has gone high, the value existing at the D input, i.e., the value of the FALL_P_DLY signal, is latched to the output Q as the ON_LATE flag. This value will be a digital 1 (logic-high) if the $V_{ds}$ voltage dropped below the $V_{ds}$ threshold $V_{TH\text{-}ds}$ before the $V_{gs}$ signal rose above the $V_{gs}$ threshold $V_{TH\text{-}gs}$. In other words, ON_LATE=1 indicates that the transistor turned on "late," i.e., after the drain-to-source voltage dropped below its threshold $V_{TH\text{-}ds}$.

D flip-flop 465 receives the RISE_P_DLY signal from the delay matching/trimming module 430 at its D input and receives the OFF.CLK.DLY signal at its clock input. Thus, when the OFF_CLK _DLY signal goes high, indicating that the gate-to-source voltage $V_{gs}$ has gone low, the value existing at the D input, i.e., the value of the RISE_P_DLY signal, is latched to the output Q as the OFF_LATE flag. This value will be a digital 1 (logic-high) if the $V_{ds}$ voltage rose above the $V_{ds}$ threshold $V_{TH\text{-}ds}$ before the $V_{gs}$ signal dropped below the $V_{gs}$ threshold $V_{TH\text{-}gs}$. In other words, OFF_LATE=1 indicates that the transistor turned off "late," i.e., after the drain-to-source voltage rose above its threshold $V_{TH\text{-}ds}$.

As explained above with respect to FIGS. 2 and 3, the PWM state machines of the primary-side control module 110 and secondary-side control module 120 use the ON_LATE and OFF_LATE flags to generate desired switching waveforms, by, for example, iteratively adjusting, based on said ON_LATE and OFF_LATE flags, the positions of the rising and falling edges of the PWM signals used to generate the gate driver signals that are provided to transistors Q1-Q8. In illustrative embodiments, the output latches and averaging logic module 460 includes averaging logic that serves to average the ON_LATE and OFF_LATE signals over multiple (for example, eight) PWM cycles to obtain the average value over a longer time period and thereby reduce noise sensitivity.

Figure 5:
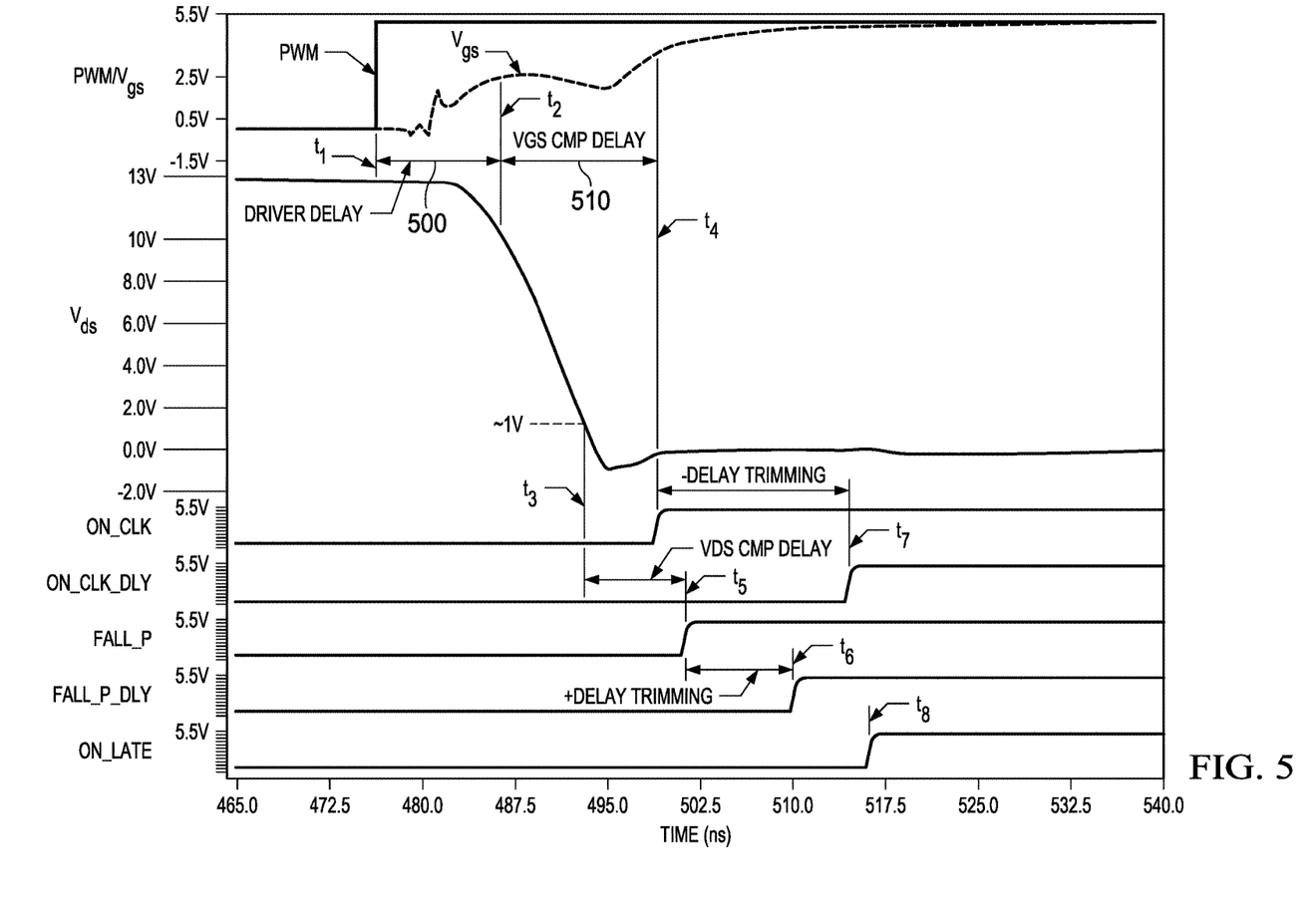
FIG. 5 is a timing diagram timing showing timing relationships for various signals in a comparator system such as that shown in FIG. 4 in accordance with illustrative timing and control schemes of the present disclosure.

FIG. 5 is a timing diagram timing showing timing relationships for various signals in a comparator system such as comparator system 400 of FIG. 4 in accordance with illustrative timing and control schemes of the present disclosure. The timing diagram of FIG. 5 shows the PWM control signal, the gate-to-source voltage $V_{gs}$, the drain-to-source voltage $V_{ds}$, the ON_CLK signal, the ON_CLK_DLY signal, the FALL_P signal, the FALL_P_DLY signal, and the ON_LATE flag. These signals are described above with respect to FIG. 4. The PWM/$V_{gs}$ plot shows both the pulse-width modulation signal PWM and the gate-to-source voltage $V_{gs}$. The PWM signal is illustratively generated by the pulse-width-modulation state machine and provided to the gate-driver circuit, which generates a gate-driver signal based on said PWM signal. The gate-to-source voltage $V_{gs}$ is representative of the gate-driver signal provided to the gate of the transistor by the gate-driver circuit. At a time $t_1$ in FIG. 5, the PWM signal goes high. After a driver delay 500, the gate-to-source voltage $V_{gs}$ crosses the transistor turn on threshold $V_{TH\text{-}gs}$, which in the illustrative embodiment of FIG. 5, is 2.5V, at a time $t_2$. After a $V_{gs}$ comparator delay 510, the ON_CLK output of the $V_{gs}$ comparator 420 goes high at a time $t_4$ in response to the $V_{gs}$ signal crossing the $V_{TH\text{-}gs}$ threshold at time $t_2$. At a time $t_3$, the drain-to-source voltage $V_{ds}$ of the transistor crosses the drain-to-source voltage threshold $V_{TH\text{-}ds}$, which in the illustrative embodiment of FIG. 5 is set at 1 V. After a $V_{ds}$ comparator delay 520, the FALL_P output of the $V_{ds}$ comparator 410 goes high at a time $t_5$ in response to the $V_{ds}$ signal crossing the $V_{TH\text{-}ds}$ threshold at time $t_3$.

As can be seen in FIG. 5, there is a delay mismatch between the $V_{gs}$ comparator delay 510 and the $V_{ds}$ comparator delay 520. That is, in the illustrative example of FIG. 5, the $V_{gs}$ comparator 420 is subject to a longer delay than the $V_{ds}$ comparator 410. The delay matching/trimming module 430 compensates for this delay mismatch by performing delay matching on the ON_CLK and FALL_P signals. Specifically, the delay elements 440 and 450 apply a delay to the FALL_P and ON_CLK signals, respectively. The amount of delay applied is defined by the trim value that is supplied to the delay elements 440 and 450. The trim values are based on the amount of delay that is inherent in each of the comparators 410 and 420 as determined, illustratively, during and after manufacture via testing and other means. The output of delay element 440, referred to as FALL_P_DLY, constitutes the delay-adjusted version of the FALL_P signal, and the output of delay element 450, referred to as ON_CLK_DLY, constitutes the delay-adjusted version of the ON_CLK signal. In accordance with the implemented delay adjustments, the FALL_P_DLY signal goes high at a time $t_6$ and the ON_CLK_DLY signal goes high at a time $t_7$. The FALL_P_DLY signal is provided to the D-flip-flop 470 of the output latches and averaging logic module 460, and the ON_CLK_DLY signal is provided to the clock input of D flip-flop 470. Thus when the ON_CLK_DLY signal goes high at time $t_7$, the value present at the D input is latched to the Q output of the flip-flop, which provides the ON_LATE flag. Since the FALL_P_DLY signal is high at time $t_7$, the ON_LATE flag goes accordingly. Due to a small delay inherent in the D flip-flop 460, the ON_LATE goes high at time $t_8$, reflecting the fact that the $V_{gs}$ signal went high, thereby turning the transistor on, late, that is, after the drain-to-source voltage $V_{ds}$ dropped below the $V_{TH\text{-}ds}$.

Figure 6:
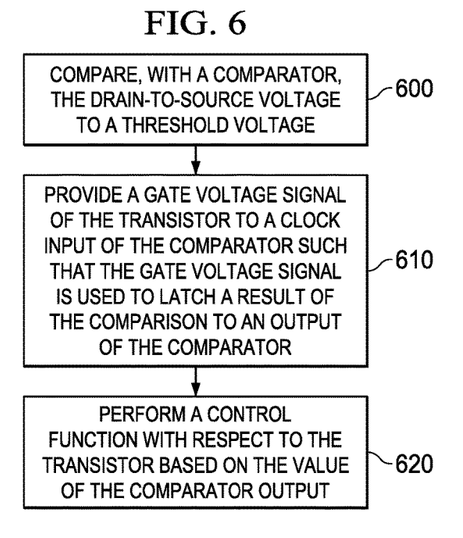
FIG. 6 is a flowchart representing a method of controlling a field-effect transistor in accordance with illustrative embodiments of the present disclosure.

FIG. 6 is a flowchart representing a method of controlling a field-effect transistor in accordance with illustrative embodiments of the present disclosure. At block 600, a comparator compares a drain-to source voltage of the transistor to a threshold voltage. At block 610, a gate voltage signal of the transistor is provided to a clock input of the comparator such that said gate voltage signal is used to latch a result of said comparison to an output of the comparator. At block 620, a control function with respect to the transistor is performed based on the value of the comparator output.

While some examples of a zero-volt-crossing detection scheme using a $V_{ds}$ comparator that uses the gate voltage of the transistor as a clock input to latch the comparator output have been described in detail herein, it is to be understood that the inventive concepts may be otherwise variously embodied and employed and that the appended claims are intended to be construed to include such variations except insofar as limited by the prior art. For example, while aspects of the disclosure are described herein with respect to wireless power transfer system, aspects of the disclosure can also be implemented with regards to substantially any system that employs zero-volt switching.

What is claimed is:

1. Comparator circuitry comprising:
   (a) a metal oxide semiconductor field effect transistor drain to source voltage, Vds, input;
   (b) a metal oxide semiconductor field effect transistor drain to source threshold voltage, VTH-ds, input;
   (c) a metal oxide semiconductor field effect transistor gate to source voltage, Vgs, clock input;
   (d) a metal oxide semiconductor field effect transistor gate to source threshold voltage, VTH-gs, input; and
   (e) an ON_LATE output;
   (f) an OFF_LATE output; and
   (g) Vds comparator circuitry having inputs coupled to the metal oxide semiconductor field effect transistor drain to source voltage, Vds, input and the metal oxide semiconductor field effect transistor drain to source threshold voltage, VTH-ds, input, and having a RISE P output and a FALL P output.

2. The comparator circuitry of claim 1 including:
   (a) first delay circuitry having an input coupled to the RISE_P output and a RISE_P_DLY output; and
   (b) second delay circuitry having an input coupled to the FALL_P output and a FALL_P_DLY output.

3. The comparator circuitry of claim 1 including a first flip flop having an input coupled to the RISE_P output, a clock input, and an output coupled to the OFF_LATE output.

4. The comparator circuitry of claim 1 including a second flip flop having an input coupled to the FALL_P output, a clock input, and an output coupled to the ON_LATE output.

5. The comparator circuitry of claim 1 including:
   Vgs comparator circuitry having inputs coupled to the metal oxide semiconductor field effect transistor drain to source voltage, Vgs, input and the metal oxide semiconductor field effect transistor drain to source threshold voltage, VTH-gs, input, and having an OFF_CLOCK output and an ON_CLOCK output.

6. The comparator circuitry of claim 5 including:
   (a) third delay circuitry having an input coupled to the OFF_CLOCK output and an OFF_CLOCK_DLY output; and
   (b) fourth delay circuitry having an input coupled to the ON_CLOCK output and an ON_CLOCK_DLY output.

7. The comparator circuitry of claim 5 including a first flip flop having a compare input, a clock input coupled to the OFF_CLOCK output, and an output coupled to the OFF_LATE output.

8. The comparator circuitry of claim 5 including a second flip flop having a compare input, a clock input coupled to the ON_CLOCK output, and an output coupled to the ON_LATE output.

9. The comparator of claim 1 in which the metal oxide semiconductor field effect transistor drain to source threshold voltage, VTH-ds, is 1 volt below a drain to source zero voltage.

10. The comparator of claim 1 in which the metal oxide semiconductor field effect transistor gate to source threshold voltage, VTH-gs, is the turn-on threshold voltage of an associated transistor.

11. A process of operating a metal oxide semiconductor field effect transistor comprising:

(a) comparing a metal oxide semiconductor field effect transistor drain to source voltage, Vds to a metal oxide semiconductor field effect transistor drain to source threshold voltage, VTH-ds;

(c) latching an ON_LATE signal in response to the comparing and in response to a rising edge of a metal oxide semiconductor field effect transistor gate to source voltage, Vgs;

(d) latching an OFF_LATE signal in response to the comparing and in response to a falling edge of the metal oxide semiconductor field effect transistor gate to source voltage, Vgs; and (e) timing the rising and falling edges of the gate to source Vgs voltage to the transistor in response to the ON_LATE signal and the OFF_LATE signal, the timing including timing the rising and falling edges of the gate to source Vgs voltage to provide a drain to source zero volt crossing timing.

12. The process of claim 11 including delaying latching the ON_LATE signal and delaying latching the OFF_LATE signal to compensate for delays inherent in the comparing.

13. The process of claim 11 in which:
(a) the comparing a metal oxide semiconductor field effect transistor drain to source voltage, Vds to a metal oxide semiconductor field effect transistor drain to source threshold voltage, VTH-ds includes providing a RISE_P output and a FALL_P output; and
(b) the timing includes delaying the RISE_P output to produce a RISE_P_DLY output, and delaying the FALL_P output to produce a FALL_P_DLY output to compensate for delays inherent in the comparing.

14. The process of claim 11 including:
(a) comparing the metal oxide semiconductor field effect transistor gate to source voltage, Vgs, to a metal oxide semiconductor field effect transistor gate to source threshold voltage, VTH-gs, to produce an OFF_CLOCK signal and an ON_CLOCK signal; and
(b) the timing includes delaying the OFF_CLOCK signal to produce an OFF_CLOCK_DLY signal, and delaying the ON_CLOCK signal to produce an ON_CLOCK_DLY signal to compensate for delays inherent in the comparing the gate to source voltage, Vgs to the threshold voltage, VTH-gs.

15. The process of claim 11 including:
(a) latching the ON_LATE signal in response to the comparing and in response to a timing of the rising edge of the gate to source voltage, Vgs;
(b) latching an OFF_LATE signal in response to the comparing and in response to a timing of the falling edge of the gate to source voltage, Vgs; and
in which the timing includes:
(c) averaging the timing of the ON_LATE signal over a plurality of cycles;h
(d) averaging the timing of the OFF_LATE signal over a plurality of cycles;
(e) adjusting the timing of the rising edge of the gate to source voltage based on an average value of the ON_LATE signal; and
(f) adjusting the timing of the falling edge of the gate to source voltage based on the average value of the OFF_LATE signal.

* * * * *